US012620870B2

(12) United States Patent
Ruppert

(10) Patent No.: US 12,620,870 B2
(45) Date of Patent: May 5, 2026

(54) POWER ELECTRONICS ARRANGEMENT FOR AN EXTERNALLY EXCITED SYNCHRONOUS MACHINE AND MOTOR VEHICLE

(71) Applicant: AUDI AG, Ingolstadt (DE)

(72) Inventor: Daniel Ruppert, Lenting (DE)

(73) Assignee: Audi AG, Ingolstadt (DE)

( * ) Notice: Subject to any disclaimer, the term of this patent is extended or adjusted under 35 U.S.C. 154(b) by 203 days.

(21) Appl. No.: 18/539,025

(22) Filed: Dec. 13, 2023

(65) Prior Publication Data

US 2024/0204625 A1 Jun. 20, 2024

(30) Foreign Application Priority Data

Dec. 14, 2022 (DE) .......................... 102022132266.7

(51) Int. Cl.
H02K 9/16 (2006.01)
H02K 5/20 (2006.01)
(Continued)

(52) U.S. Cl.
CPC ................. H02K 9/16 (2013.01); H02K 5/20 (2013.01); H02K 9/19 (2013.01); H02K 11/33 (2016.01); H05K 7/209 (2013.01)

(58) Field of Classification Search
CPC ........ H05K 7/209; H02K 11/33; H02K 11/30; H02K 9/00; H02K 9/02; H02K 9/04;
(Continued)

(56) References Cited

U.S. PATENT DOCUMENTS

2021/0092882 A1* 3/2021 Ruppert ............. H05K 7/14322

FOREIGN PATENT DOCUMENTS

| CN | 111933600 A | 11/2020 |
| DE | 4421025 A1 | 12/1995 |
| (Continued) | | |

OTHER PUBLICATIONS

Apelsmeier et al, Power Electronics Device for a Separately Excited Synchronous Machine and Motor Vehicle, Apr. 29, 2021, DE102019128721 (English Machine Translation) (Year: 2021).*
(Continued)

*Primary Examiner* — Alexander A Singh
(74) *Attorney, Agent, or Firm* — Seed Intellectual Property Law Group LLP

(57) ABSTRACT

A power electronics arrangement for an externally excited synchronous machine, may include an inverter power module for each phase of the synchronous machine to form an inverter, an exciter power module including an exciter circuit as well as a common heat sink, to which the power modules are secured and thermally coupled for cooling. The heat sink may comprise a cavity including cooling structures for each inverter power module, each cooling structure being situated adjacent to a respective inverter power module. The cavity may receive a flow for active cooling of the power modules of a cooling fluid entering through an inflow opening of the heat sink to an outflow opening of the heat sink. A cooling structure may be associated with the exciter power module, the cooling structure being adjacent to the excited power module in the cavity.

9 Claims, 2 Drawing Sheets

(51) Int. Cl.
    *H02K 9/19*       (2006.01)
    *H02K 11/33*     (2016.01)
    *H05K 7/20*      (2006.01)

(58) Field of Classification Search
    CPC .. H02K 9/06; H02K 9/08; H02K 9/16; H02K
             9/19; H02K 9/22; H02K 5/18; H02K 5/20
    USPC ........................ 310/52, 54, 57, 58, 60 A, 64
    See application file for complete search history.

(56)                References Cited

FOREIGN PATENT DOCUMENTS

| DE | 102017118200 | A1 | | 2/2018 | |
|----|--------------|----|----|--------|----|
| DE | 102019128721 | A1 | * | 4/2021 | .............. B60L 50/51 |
| DE | 102019132685 | A1 | | 6/2021 | |
| DE | 102021202552 | A1 | * | 9/2022 | ........... H01L 23/473 |
| DE | 102021203851 | A1 | | 10/2022 | |

OTHER PUBLICATIONS

Gesellmann et al, Multiple Inverter with a Heat Sink, Sep. 22, 2022,
DE 102021202552 (English Machine Translation) (Year: 2022).*

* cited by examiner

POWER ELECTRONICS ARRANGEMENT FOR AN EXTERNALLY EXCITED SYNCHRONOUS MACHINE AND MOTOR VEHICLE

BACKGROUND

Technical Field

Embodiments of the invention relate to a power electronics arrangement for an externally excited synchronous machine, such as those included in a motor vehicle.

Description of the Related Art

An externally excited synchronous machine (ESM) makes do with no magnetic materials in the rotor, by contrast with a permanently excited synchronous machine (PSM). Instead, a magnetic field is generated by flow through an exciter winding in the rotor. This has the benefit of additional degrees of freedom in the regulating and design of the synchronous machine. In a power electronics arrangement for an externally excited synchronous machine, therefore, not only is an inverter required between a DC voltage and the customary multiphase alternating voltages on the stator windings, but also an exciter circuit for the exciter winding.

It is known in the art to provide the exciter circuit in an exciter power module and the inverter by inverter power modules for each phase, especially half-bridge modules. Since the power electronic components, especially semiconductor switches and/or diodes of these power modules, i.e., of the exciter power module and the at least one inverter power module, become heated during operation, a cooling is required. While it was typically considered to cool the exciter power module by convection of air, it has been disclosed, for example in DE 10 2019 128 721 A1, to fasten and attach the exciter power module in addition thermally to a heat sink provided for the at least one inverter power module. In this way, an improved cooling of the exciter circuit and its power electronic components was achieved, so that they could be designed smaller.

Since the bulk of the lost power occurs in the three inverter power modules for the stator windings, the heat sink is typically designed such that these inverter power modules are cooled the best way possible. In particular, cooling structures are provided between an inflow opening in a cavity of the heat sink receiving a flow of a cooling fluid and an outflow opening from the heat sink adjacent to the thermal coupling site of the inverter power modules, which define in particular cooling pathways and/or increase the cooling surfaces and/or produce swirling of the cooling fluid, which is typically cooling water.

Oblong configurations of the heat sink have been disclosed, in which the inverter power modules are arranged centrally in the longitudinal direction, in particular being arranged directly adjacent for multiple phases. The exciter power module could additionally be provided in the longitudinal direction adjacent to an inlet side, especially next to the inflow opening, or at an outlet side, especially next to the outflow opening.

In this case, the exciter power module cannot receive an active flow of cooling fluid around or underneath it, since the cooling fluid is taken without swirling through the inflow opening in the direction of the inverter power modules for the stator. The same is true of the outflow side. Because of this, the exciter power module is not optimally cooled. Thermal simulations have also shown that temperatures may occur in the region where the exciter power module is thermally coupled to the heat sink that are up to 30 K higher than those in the region of the cooling structures for the inverter power modules.

Thus, it can be said that there is no optimal cooling link for the exciter power module, so that a larger design in terms of the power semiconductor components may be required for the necessary exciter power. For example, a large design space may be provided for a power semiconductor component realized as a chip, so that its heat can be distributed and taken away by a larger surface. This leads to higher manufacturing costs, higher design volume, and greater weight of the exciter power module. Furthermore, neither design provides optimal efficiency of the exciter power module, since greater losses occur, higher design volume is required due to larger intermediate circuit capacitors, and the weight is increased. The maximum output power may be decreased by premature derating. Furthermore, a decreased service life of the exciter power module may occur due to thermal stress.

CN 111 933 600 A discloses a DBC substrate, the underside of which is directly bathed in the flow of a cooling medium. A swirl flow structure is provided inside the cavity immediately adjacent to the DBC substrate.

BRIEF SUMMARY

Embodiments of the present disclosure provide an improved power electronics arrangement in terms of performance capability, service life, efficiency and manufacturing expense of the exciter power module.

Embodiments may include a power electronics arrangement including a cooling structure adjacent to the exciter power module in the cavity.

The power modules, i.e., the exciter power module and the at least one inverter power module, may encompass the power electronic components of the respectively provided circuits, such as on a power electronic substrate. The power modules may be at least partially molded, including the inverter power modules, such as by a hardening and shaping casting compound. In some embodiments, the power modules, such as the excited power module may be realized by or may partially be realized by a frame module with gel casting.

The heat sink may be a closed heat sink, such that the cavity has no openings to the power modules. Therefore, as is common for applications in motor vehicles, there may be no direct contact between the cooling fluid and the power modules, including their substrates.

Embodiments may substantially improve the cooling link of the exciter power module by adapting the heat sink in the region of the exciter power module such that there is a cooling structure configured to provide an improved underflow for the exciter power module by providing a corresponding flow pathway, an enlargement of the bathed cooling surface, and/or swirling of the coolant. As a result of the improved cooling link, an improvement in the performance capability and service life of the exciter power module may be achieved and the exciter power module may be designed smaller and more cost-saving. In such embodiments, less surface may be required for the necessary exciter power for the power semiconductor components of the exciter power module. Moreover, the substrate surface, such as the surface of a DBC substrate, may be reduced overall. The design volume and the weight of the exciter power module, and the overall weight of the power electronics arrangement, may be reduced, as a result of lower losses, smaller design volume, and lower weight. A premature derating and associated decrease in the maximum output power may be avoided. By reducing the thermal stress, the service life may be increased.

In some embodiments, the heat sink may be fashioned as a cooling plate and/or may consist of or comprise aluminum. A cooling plate may allow a compact, easily manipulated configuration. Aluminum may be suitable as the material based on its robustness and good thermal conductivity.

The at least one inverter power module may be arranged at the middle of the oblong shaped heat sink and the exciter power module may connect to a longitudinal end or on an inlet side encompassing the inflow opening. For example, the cooling structure associated with the exciter power module may be arranged between the inflow opening and the at least one cooling structure of the at least one inverter power module. Hence, only one side feed pathway may need to be modified in the heat sink, as compared to the prior art. When there are multiple inverter power modules, the multiple inverter power modules and their associated cooling structures may be arranged in succession in the longitudinal direction. The inverter power modules and the cooling structures associated with them may form a middle block, which may need not be altered in some embodiments.

In some embodiments, the cooling structures each may define cooling pathways which are closed off relative to the other cooling structures. For example, these cooling pathways may extend directly beneath the corresponding power module and significantly increase the cooling surface and thus the efficiency of the cooling, for example, by following a meandering course. When multiple inverter power modules are present, the cooling pathways may run parallel from an inflow side to an outflow side. In such embodiments, cooling fluid of essentially the same temperature may be carried in the cooling pathways for all cooling structures and thus all cooling pathways of all inverter power modules, such that an at least substantially identical cooling effect results, which may not be affected by heating along an already traveled cooling pathway of another inverter power module.

The cooling pathway of the exciter power module may run from the inflow opening to the inflow side. In such embodiments, the cooling pathway of the exciter power module is may be switched in series with the parallel cooling pathways of the inverter power modules. As the greatest power loss may occur in the inverter power modules, no excessive change in the temperature of the cooling fluid may be expected from the exciter power module and the associated cooling structure. In other words, the cooling structure of the exciter power modules may contribute to maintaining the region of the exciter power module permanently at a lower temperature. When a cooling pathway of the exciter power module is provided in series with parallel cooling pathways of the inverter power modules, the cavity with the cooling structures and cooling pathways for the inverter power module region may be unchanged and only a change in the area from the inflow opening to the inflow side may be required in order to achieve a substantial improvement in regard to the exciter power module while maintaining the cooling of the inverter power modules.

In some embodiments, the cooling structures may encompass further substructures for improving the cooling effect. For example, the cooling structures may encompass at least one substructure for increasing the effectively bathed cooling surface and/or for swirling of the cooling fluid, such as cooling fins and/or cooling pins. Both swirling and increased bathed cooling surfaces may result in an improved cooling attachment in the area of the cooling structure. Suitable substructures already known in the prior art may be employed in some embodiments.

In some embodiments, the cooling structures may not define any complex cooling pathways or the like, but instead the cavity extends straight through in the longitudinal direction from the inflow opening to the outflow opening, and in the region of each power module, the cooling structures may be formed as substructures for increasing the effectively bathed cooling surface and/or for swirling the cooling fluid. In such embodiments, the cavity as a whole may receive the flow, but a better cooling is provided by forced convection where required.

The power modules may be thermally attached to the heat sink such as by soldering, sintering, screw fastening, and/or clamping. In some embodiments, at least one inverter power module may be attached by soldering and/or sintering and the exciter power module may be attached by screw fastening and/or clamping. In such embodiments, excellent thermal coupling may be made possible. The above-described embodiments may provide a distinct improvement of the cooling of power modules having diverse layouts and diverse connection techniques to a closed heat sink, wherein inverter power modules may be attached by soldering or sintering, and the exciter power module may be attached by screw fastening or clamping.

The present disclosure also relates to a motor vehicle, which may comprise an externally excited synchronous machine as a traction machine, and a power electronics arrangement as described herein. The discussion of the power electronics arrangement above may be applied analogously to the motor vehicle described herein, which may enable the mentioned benefits to likewise be achieved. The externally excited synchronous machine may be three-phase.

DETAILED DESCRIPTION

Figure 1:
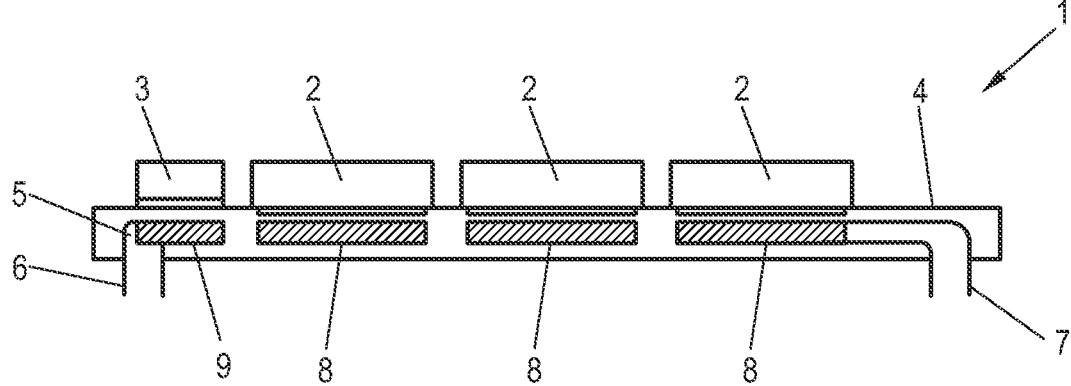
FIG. 1 shows a schematic cross-sectional view of a power electronics arrangement.

FIG. 1 shows a schematic cross-sectional view of a first exemplary embodiment of a power electronics arrangement 1. The power electronics arrangement 1 may be associated with a three-phase externally excited synchronous machine, such as in a motor vehicle, and the power electronics arrangement 1 may include an inverter for converting between a DC voltage and the three-phase alternating voltage of the stator windings, and an exciter circuit for providing of exciter power for an exciter winding of the rotor. The power electronics arrangement 1 may comprise an inverter power module 2 for each phase, such as a half-bridge module. The power electronics arrangement 1 may include an exciter power module 3. The power modules 2, 3 may each comprise power semiconductor components, such as those already known in the prior art, including semiconductor switches and/or diodes. In order to cool the power semiconductor components, the power modules 2, 3 may be fastened to a heat sink 4 and thermally coupled thereto. The heat sink 4 in some embodiments may be configured as a cooling plate and may consist of or comprise aluminum. The heat sink 4 may be a closed heat sink 4, such as one not open to the modules 2, 3. The connection of the power modules 2, 3 to the heat sink 4 may be accomplished by sintering or soldering for the inverter power modules 2 and/or by screw fastening or clamping for the exciter power module 3.

For the active cooling of the power modules 2, 3, the heat sink 4 may include a cavity 5, into which cooling fluid, such as cooling water, may flow through an inflow opening 6, and from which the cooling fluid may flow out through an outflow opening 7. The cavity 5 may include not only cooling structures 8 configured to locally improve the cooling effect for the inverter power modules 2 situated next to them, but also a cooling structure 9 next to the exciter power module 3 configured to cool the excited power module 3. The cooling structures 8, 9 may define cooling pathways and/or contain substructures which increase the bathed cooling surface in the cavity 5 and/or provide swirling which improves the cooling effect.

Figure 2:
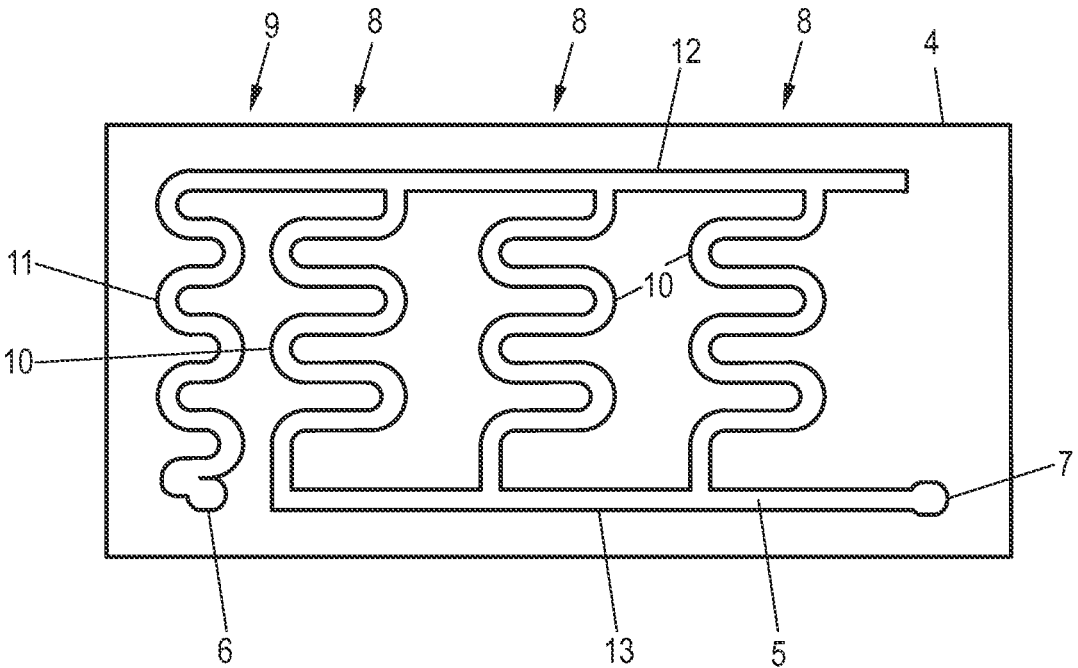
FIG. 2 shows flow pathways within a heat sink of the power electronics arrangement of FIG. 1.

In some embodiments, such as the embodiment shown in FIG. 2, the cooling structures 8, 9 may define flow pathways 10, 11, such as, for example, meandering flow pathways 10, 11. The flow pathways 10 of the cooling structures 8 of the inverter power modules 2 may run in parallel from an inflow side 12 to an outflow side 13, which may achieve the same cooling performance for all inverter power modules 2. The cooling pathway 11 may run from the inflow opening 6 to the inflow side 12 and may be configured to be in series with the parallel arrangement. In such embodiments, the region in which the exciter power module 3 is fastened may be kept constantly cool, and may avoid excessive heating due to the cooling structures 8. In addition to defining the flow pathways 10, 11, the cooling structures 8, 9 may also include substructures for further increasing the bathed cooling surface and/or for swirling, such as cooling fins and/or cooling pins.

Figure 3:
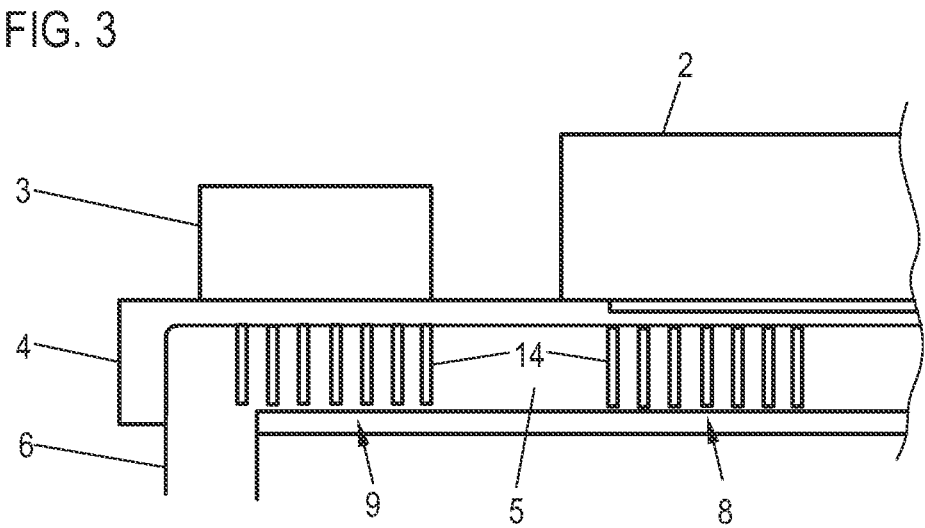
FIG. 3 shows a configuration of the heat sink in an exemplary embodiment of a power electronics arrangement.

FIG. 3 shows an embodiment in which a continuous cavity 5 includes the cooling plate 4, such that convection may be locally increased by the cooling structures 8, 9, such as by the use of cooling pins 14 as substructures increasing the bathed cooling surface and creating swirling.

Figure 4:
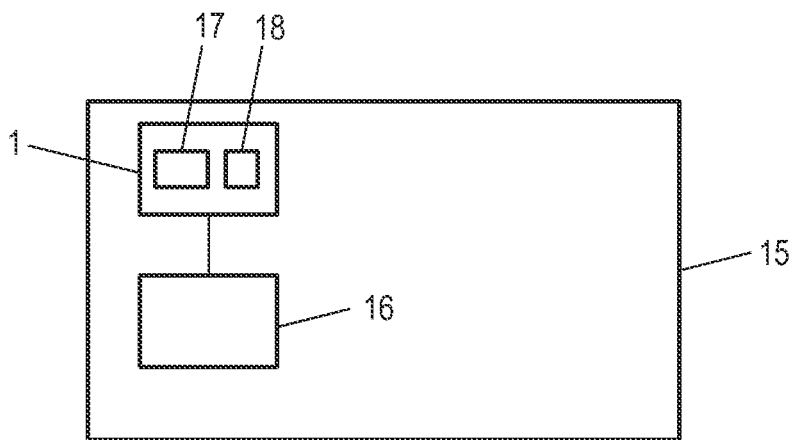
FIG. 4 shows a diagram of a motor vehicle.

FIG. 4 shows a diagram of a motor vehicle 15. In some embodiments, the motor vehicle 15 may include an electric motor and a three-phase externally excited synchronous machine 16 associated with a power electronics arrangement 1, such as described above. The exciter circuit 17 of the exciter power module 3 may be connected to an exciter winding in the rotor, while the inverter 18 of the inverter power module 2 may be connected to the stator windings.

German patent application no. 10 2022 133266.7, filed Dec. 14, 2022, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A power electronics arrangement for an externally excited synchronous machine, comprising:
an inverter, including a plurality of inverter power modules the plurality of inverter power modules including one inverter power module for each phase of the externally excited synchronous machine; and
an exciter power module having an exciter circuit, a common heat sink having a cavity, and an exciter cooling structure, the inverter and exciter power modules being secured and thermally coupled to the heat sink for cooling and the exciter cooling structure positioned adjacent to the exciter power module in the cavity,
wherein the cavity includes at least one inverter cooling structure, including one inverter cooling structure for each inverter power module each inverter cooling structure of the at least one inverter cooling structure positioned adjacent a respective inverter power module,
wherein the cavity is configured to receive a flow for active cooling of the inverter and exciter power modules of a cooling fluid entering through an inflow opening of the common heat sink to an outflow opening of the common heat sink,
wherein the exciter and inverter cooling structures each define cooling pathways separate from other exciter and inverter cooling structures,
wherein the cooling pathways of each inverter power module of the plurality of inverter power modules run parallel to one another, and
wherein each cooling pathway is configured to underlie and primarily cool only a respective one of the plurality of inverter power modules.

2. The power electronics arrangement according to claim 1, wherein the common heat sink is oblong shaped, the at least one inverter power module is arranged at a middle of the oblong shaped common heat sink, and the exciter power module connects to a longitudinal end to an inlet side of the common heat sink, the inlet side being present on a longitudinal end of the heat sink and encompassing the inflow opening.

3. The power electronics arrangement according to claim 2, wherein when the at least one inverter power module includes a plurality of inverter power modules, the plurality of inverter power modules and associated cooling structures are arranged in succession in the longitudinal direction.

4. The power electronics arrangement according to claim 1, wherein the cooling pathways of the plurality of inverter power modules run parallel from an inflow side to an outflow side.

5. The power electronics arrangement according to claim 4, wherein the cooling pathway of the exciter power module runs from the inflow opening to the inflow side.

6. The power electronics arrangement according to claim 1, wherein the heat sink is a cooling plate and/or comprises of aluminum.

7. The power electronics arrangement according to claim 1, wherein the exciter and inverter cooling structures each encompass at least one substructure for increasing the effectively bathed cooling surface and/or for swirling of the cooling fluid.

8. The power electronics arrangement according to claim 1, wherein the at least one inverter power module is attached by soldering and/or sintering and the exciter power module is attached by screw fastening and/or clamping.

9. A motor vehicle, comprising an externally excited synchronous machine as a traction machine, and a power electronics arrangement according to claim 1.

* * * * *